(12) United States Patent
Casper et al.

(10) Patent No.: US 7,199,743 B2
(45) Date of Patent: Apr. 3, 2007

(54) CYCLIC DIGITAL TO ANALOG CONVERTER

(75) Inventors: Bryan K. Casper, Hillsboro, OR (US); Craig S. Petrie, Provo, UT (US)

(73) Assignee: Intel Corporation, Santa Clara, CA (US)

( * ) Notice: Subject to any disclaimer, the term of this patent is extended or adjusted under 35 U.S.C. 154(b) by 185 days.

(21) Appl. No.: 11/025,579

(22) Filed: Dec. 29, 2004

(65) Prior Publication Data

US 2006/0139195 A1 Jun. 29, 2006

(51) Int. Cl.
*H03M 1/66* (2006.01)
(52) U.S. Cl. ...................... 341/150; 341/155
(58) Field of Classification Search ........ 341/140–170, 341/172
See application file for complete search history.

(56) References Cited

U.S. PATENT DOCUMENTS 5,065,157 A * 11/1991 Ribner et al. ............... 341/143
5,392,043 A * 2/1995 Ribner ........................ 341/143
5,459,464 A * 10/1995 Beneteau et al. ........... 341/143
5,990,819 A * 11/1999 Fujimori .................... 341/150

OTHER PUBLICATIONS

Ginetti, Bernard , "A CMOS 13-b Cyclic RSD A/D Converter", *IEEE Journal of Solid-State Circuits*, vol. 27, No. 7, (Jul. 1992),pp. 957-965.
Matsumoto, Hiroki , "Switched-Capacitor Algorithmic Digital-to-Analog Converters", *IEEE Transactions on Circuits ans Systems* , vol. CAS-33, No. 7, (Jul. 1986),pp. 721-724.
Moussavi, Mohsen , "A Differential Bipolar Quasi-Passive Cyclic Digital-to-Analog Converter with 4.416 MSps Conversion Rate and -77dB THD", *IEEE 2001 Custom Integrated Circuits Conference*, (2001),pp. 161-164, "No Month ".

* cited by examiner

*Primary Examiner*—Lam T. Mai
(74) *Attorney, Agent, or Firm*—LeMoine Patent Services, PLLC

(57) ABSTRACT

A digital to analog converter (DAC) circuit operates least significant bit (LSB) first.

17 Claims, 4 Drawing Sheets

CYCLIC DIGITAL TO ANALOG CONVERTER

FIELD

The present invention relates generally to electronic circuits, and more specifically to digital to analog converter circuits.

BACKGROUND

Digital to analog converter (DAC) circuits convert digital words into voltage values. Some DAC circuits operate most significant bit (MSB) first, in which bits in the digital word are input to the DAC from the most significant to least significant. Other DAC circuits operate least significant bit (LSB) first, in which bits in the digital word are input to the DAC from the least significant to the most significant.

DESCRIPTION OF EMBODIMENTS

Figure 1:
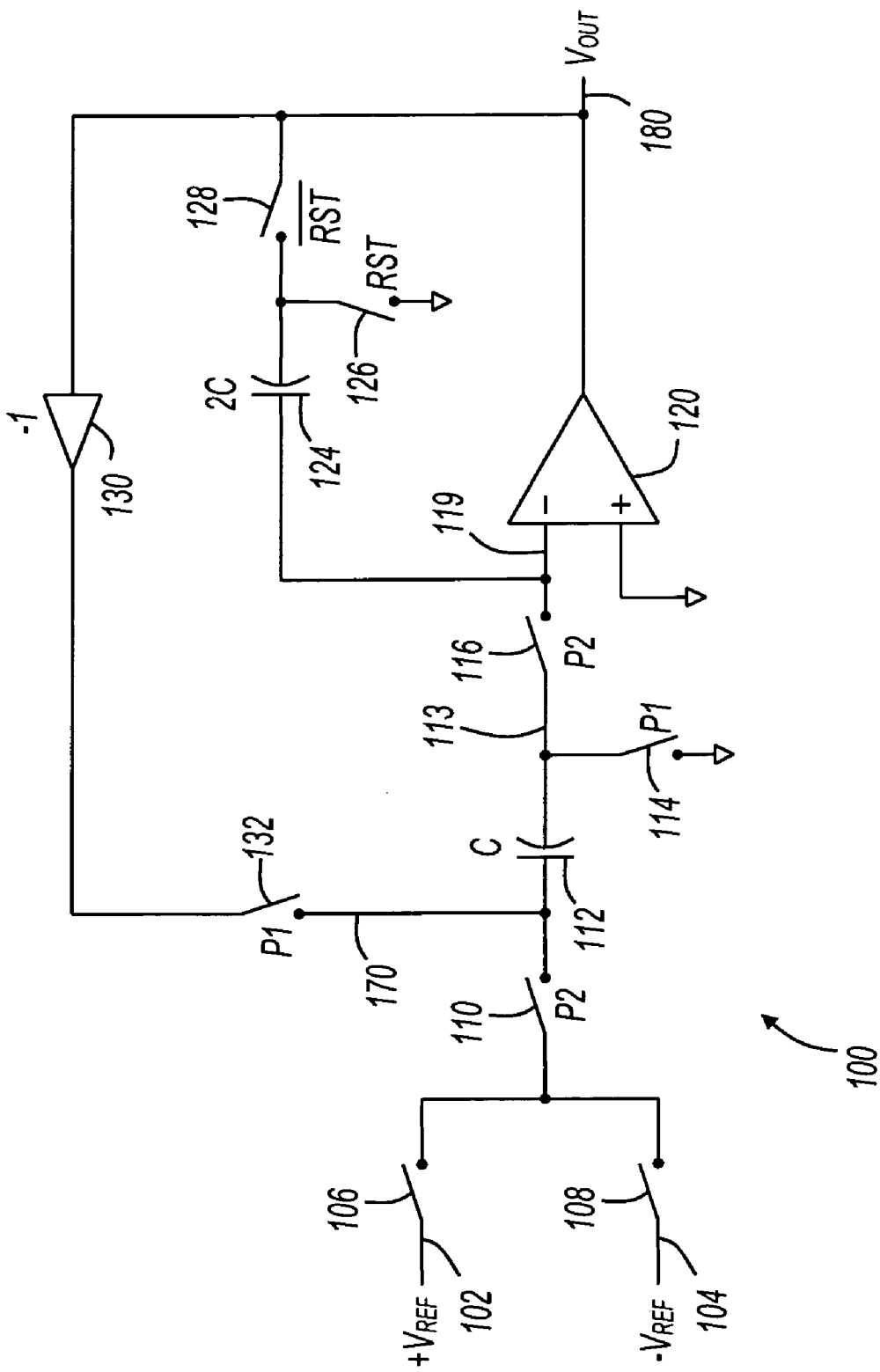
FIG. 1 shows a single-ended digital to analog converter circuit.

In the following detailed description, reference is made to the accompanying drawings that show, by way of illustration, specific embodiments in which the invention may be practiced. These embodiments are described in sufficient detail to enable those skilled in the art to practice the invention. It is to be understood that the various embodiments of the invention, although different, are not necessarily mutually exclusive. For example, a particular feature, structure, or characteristic described herein in connection with one embodiment may be implemented within other embodiments without departing from the spirit and scope of the invention. In addition, it is to be understood that the location or arrangement of individual elements within each disclosed embodiment may be modified without departing from the spirit and scope of the invention. The following detailed description is, therefore, not to be taken in a limiting sense, and the scope of the present invention is defined only by the appended claims, appropriately interpreted, along with the full range of equivalents to which the claims are entitled. In the drawings, like numerals refer to the same or similar functionality throughout the several views.

FIG. 1 shows a digital to analog converter (DAC) circuit. In general, DAC 100 operates as an N-bit DAC that generates an output voltage $V_{OUT}$ from a digital input code $b_1 b_2 b_3 \ldots b_N$ according to the following formula:

$$V_{OUT} = \sum_{i=1}^{N} b_i 2^{-i} V_{REF},$$

where $b_i$ can be either +1 or −1, $b_1$ is the most significant bit (MSB) of the digital input code, and $b_N$ is the least significant bit (LSB) of the digital input code. The output $V_{OUT}$ is constrained by $-V_{REF} < V_{OUT} < +V_{REF}$. The above formula can be rewritten as an iterative expression to form a cyclic DAC algorithm as follows:

$$V(i) = \frac{[V(i-1) + b_{N+1-i} V_{REF}]}{2}.$$

In this algorithm, an unscaled version of $V_{REF}$ is either added or subtracted to the previous "residue" signal, and the entire result is halved. Addition or subtraction is determined by each bit of the digital input code, starting with the LSB. FIG. 1 shows a DAC circuit that implements a single-ended version of this algorithm. In some embodiments, a differential implementation may also be used.

DAC circuit 100 includes operational amplifier (opamp) 120, feedback amplifier 130, and capacitors 112 and 124. DAC circuit 100 also includes switches 106, 108, 110, 114, 116, 126, 128, and 132. Switches 126 and 128 are controlled by a reset signal shown as RST in FIG. 1. Further, switches 114 and 132 (the "P1 switches") are controlled by a first signal shown as P1, and switches 110 and 116 (the "P2 switches") are controlled by a second signal shown as P2.

The switches shown in FIG. 1 may be implemented using any suitable circuit element(s). For example, in some embodiments, one or more switches are implemented using isolated gate transistors such as metal oxide semiconductor field effect transistors (MOSFET). Further, in some embodiments, complementary MOSFETs are coupled in parallel to form pass gates. For example, a n-channel MOSFET may be coupled in parallel with a p-channel MOSFET as a pass gate to implement one or more switches in FIG. 1.

In operation, DAC 100 is reset by asserting the RST signal to close switch 126 and open switch 128. In some embodiments the P1 switches and P2 switches are also closed during a reset of DAC 100. After a reset, RST is de-asserted for the remainder of the conversion of $b_1 b_2 b_3 \ldots b_N$ to $V_{OUT}$. When RST is deasserted, switch 128 closes and switch 126 opens, to form a feedback circuit from output node 180 to input node 119. The feedback circuit includes capacitor 124 which has a capacitance value of 2C, where C is any value of capacitance.

After DAC 100 is reset as described in the above paragraph, the conversion process is started. During the conversion process, input bits from the digital input code are utilized LSB first, and for each input bit, signals P1 and P2 are alternately asserted. The time period during which P1 is asserted is referred to herein as "phase one" for a particular input bit, and the time period during which P2 is asserted is referred to herein as "phase two" for the input bit.

In some embodiments, phases one and two do not overlap. For example, the switches that are closed during phase one are opened prior to the phase two switches closing during phase two. Likewise, the phase two switches are opened prior to the phase one switches closing.

During phase one, switch 114 is closed to couple node 113 to a reference potential, and switch 132 is closed to provide a feedback path with a gain of substantially −1 between node 180 and node 170. During phase two, a positive or negative reference voltage ($V_{REF}$) is conditionally applied to the input capacitor 112 based on the value of the current input bit. Each input bit is used to control the application of either $+V_{REF}$ or $-V_{REF}$ to capacitor 112. For example, when the current input bit is a "0," switch 106 is closed and $+V_{REF}$ is applied to the input capacitor 112, and when the current input bit is a "1," switch 108 is closed and $-V_{REF}$ is applied to input capacitor 112.

During phase two, switch 116 is also closed, forming an integrating amplifier with input capacitor 112 having a capacitance C, opamp 120, and feedback capacitor 124 having a capacitance of 2C. The change in voltage on node 170 is integrated, and the output voltage is changed by negative one half times the change in the voltage on node 170. This process is successively repeated for each input bit until all input bits have been processed.

Two examples are now provided to demonstrate the operation of DAC 100. The first example converts a digital input code of 111 into an output voltage, and the second example converts a digital input code of 101 into an output voltage. For this example, $+V_{REF}$ is set at 1 Volt, and $-V_{REF}$ is set at −1 Volt. Table 1 shows the mapping of digital input codes to output voltages for N=3.

TABLE 1

| Digital Input Code | Output Voltage |
|---|---|
| 111 | 7/8 |
| 110 | 5/8 |
| 101 | 3/8 |
| 100 | 1/8 |
| 011 | −1/8 |
| 010 | −3/8 |
| 001 | −5/8 |
| 000 | −7/8 |

The first example shows the operation of DAC 100 with a digital input equal to 111. The DAC operates on the digital input LSB first, where the LSB is identified as "BIT 0" and the MSB is identified as "BIT 1." Table 2, below, shows the voltage on node 170, the change in voltage on node 170 during phase two, and the output voltage.

TABLE 2

Input = 111

|  | Node 170 | Node 170 Change | $V_{OUT}$ |
|---|---|---|---|
| Bit 0, P1 | 0 |  | 0 |
| Bit 0, P2 | −1 | −1 | 1/2 |
| Bit 1, P1 | −1/2 |  | 1/2 |
| Bit 1, P2 | −1 | −1/2 | 3/4 |
| Bit 2, P1 | −3/4 |  | 3/4 |
| Bit 2, P2 | −1 | −1/4 | 7/8 |

The second example shows the operation of DAC 100 with a digital input equal to 101. The DAC operates on the digital input LSB first, where the LSB is identified as "BIT 0" and the MSB is identified as "BIT 1." Table 3, below, shows the voltage on node 170, the change in voltage on node 170 during phase two, and the output voltage.

TABLE 3

Input = 101

|  | Node 170 | Node 170 Change | $V_{OUT}$ |
|---|---|---|---|
| Bit 0, P1 | 0 |  | 0 |
| Bit 0, P2 | −1 | −1 | 1/2 |
| Bit 1, P1 | −1/2 |  | 1/2 |
| Bit 1, P2 | 1 | 3/2 | −1/4 |
| Bit 2, P1 | 1/4 |  | −1/4 |
| Bit 2, P2 | −1 | −5/4 | 3/8 |

Figure 2:
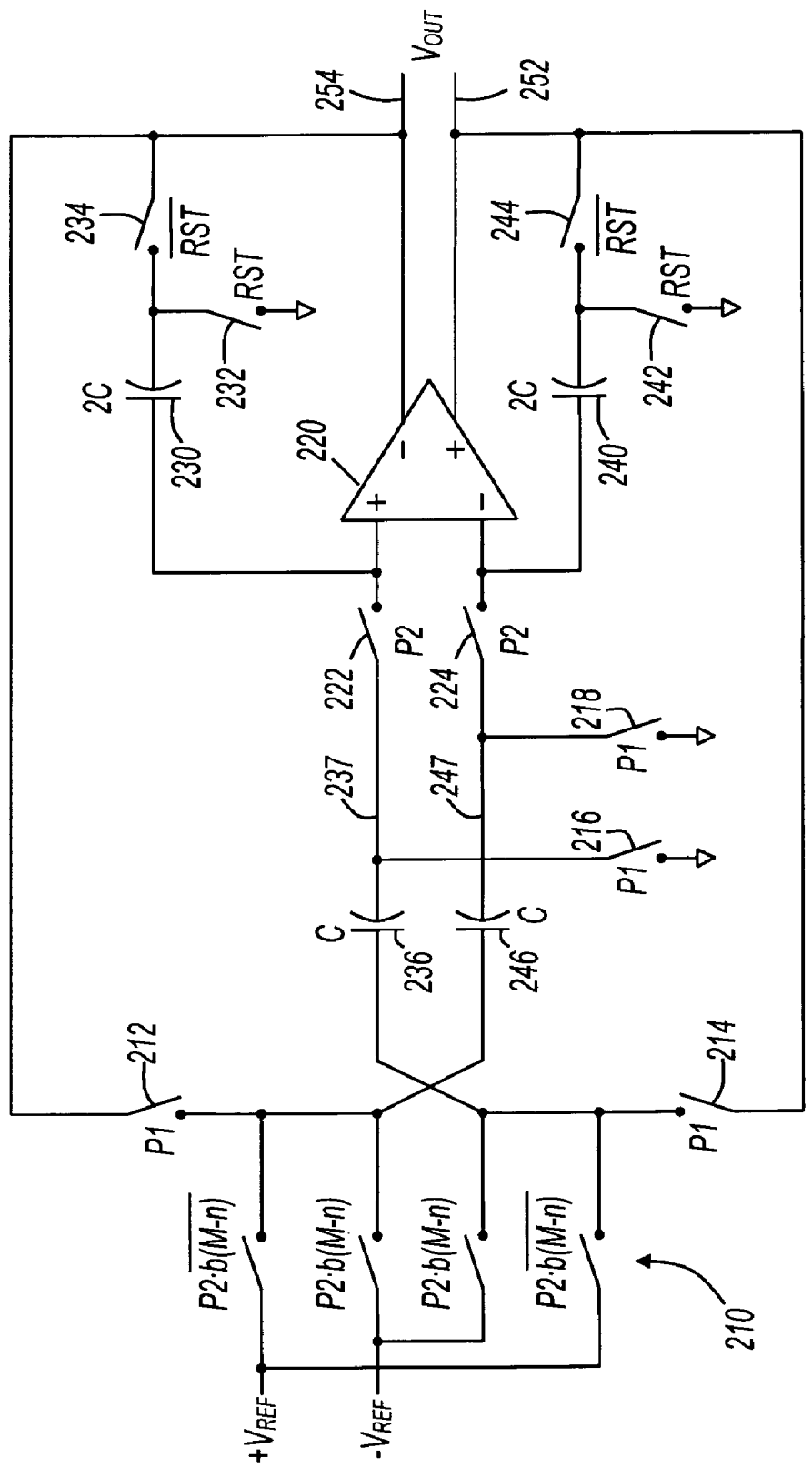
FIG. 2 shows a differential digital to analog converter circuit.

FIG. 2 shows a differential digital to analog converter. DAC 200 includes differential opamp 220, capacitors 230, 236, 240, and 246, and switches 210, 212, 214, 222, 224, 232, 234, 242, and 244. Switches 232, 234, 242, 244 are reset switches as described above with reference to FIG. 1. Switches 212, 214, 216, and 218 are P1 switches, and switches 222 and 224 are P2 switches.

The operation of DAC 200 is similar to the operation of DAC 100 (FIG. 1). For example, during reset, switches 234 and 244 are open, switches 232 and 242 are closed, P1 switches are closed, and P2 switches are closed. After DAC 200 is reset, P1 and P2 alternate for each bit in the digital input word, and the digital input word is applied LSB first.

During P1, the output of opamp 220 is fed back with a negative unity gain by feeding each output of opamp 220 to an input of opposite polarity. For example, the positive output on node 252 is fed back to capacitor 236, which is coupled to the negative input of opamp 220. Also for example, the negative output on node 254 is fed back to capacitor 246, which is coupled to the positive input of opamp 220. Also during P1, switches 216 and 218 close to remove any charge from nodes 237 and 247.

During P2, switches 222 and 224 are closed to couple capacitors 236 and 246 to the input nodes of opamp 220. In this configuration, opamp 220 and capacitors 236, 246, 230, and 240 form a differential integrator, and the output voltage settles to negative one half of the change in voltage on nodes 237 and 247 when switches 222 and 224 close.

Switches 210 combine the functionality of switches 106, 108, and 110 (FIG. 1). For example, two of the four switches 210 close during P2 based on the value of the current input bit. Two switches are closed when b(M-n) is true, and two switches are closed when b(M-n) is false, where b( ) is the bit value, M is the total number of bits, and n is the subscript of the current input bit. As shown in FIG. 2, $+V_{REF}$ is applied to capacitors 236 and 246 when the current input bit is a "0," and $-V_{REF}$ is applied to capacitors 236 and 246 when the current input bit is a "".

Figure 3:
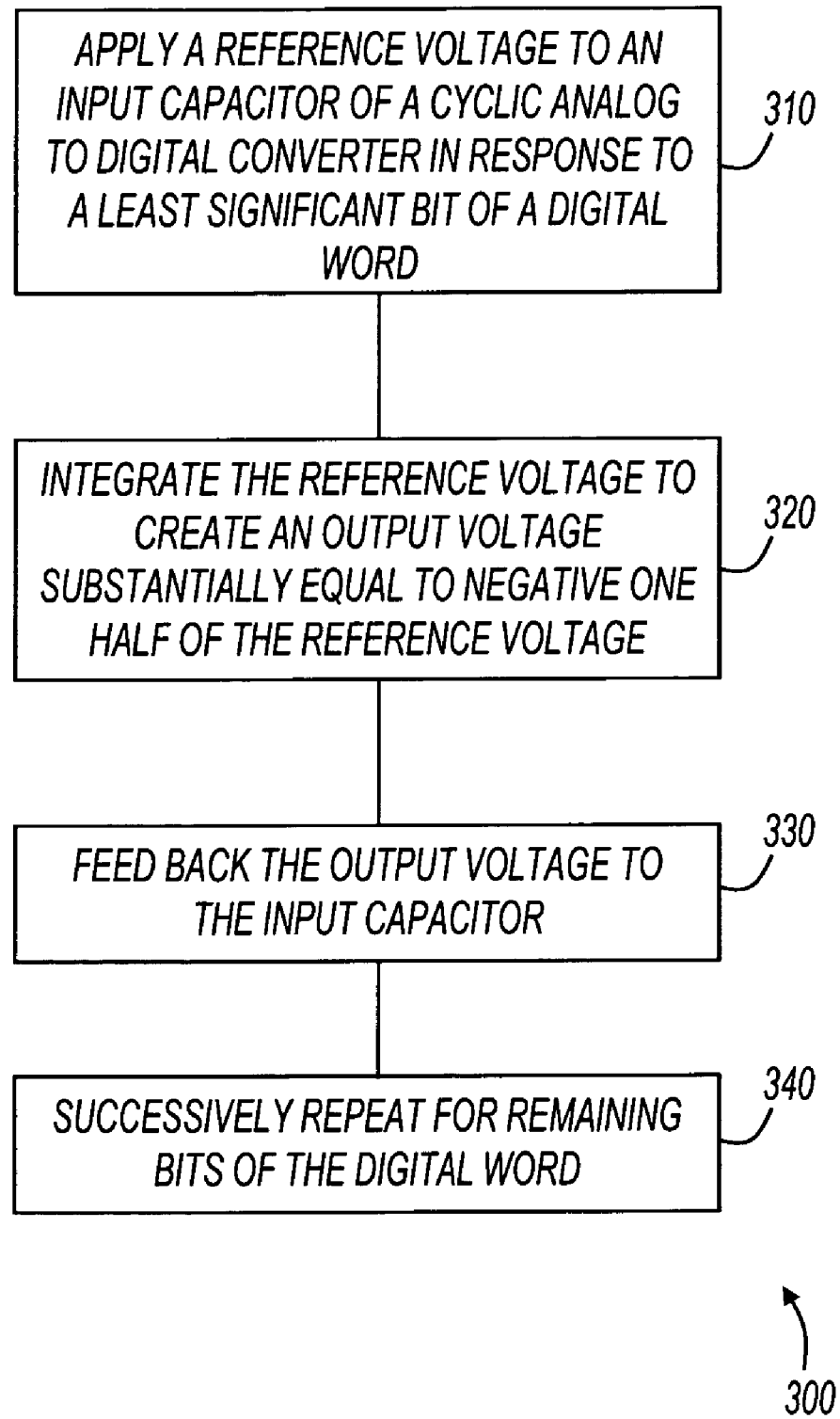
FIG. 3 shows a flowchart in accordance with various embodiments of the present invention.

FIG. 3 shows a flowchart in accordance with various embodiments of the present invention. In some embodiments, method 300 is performed by a single-ended cyclic DAC circuit such as DAC 100 (FIG. 1). In other embodiments, method 300 is performed by a differential DAC circuit such as DAC 200 (FIG. 2). In some embodiments, method 300, or portions thereof, is performed by an integrated circuit, embodiments of which are shown in the various figures. Method 300 is not limited by the particular type of apparatus or software element performing the method. The various actions in method 300 may be performed in the order presented, or may be performed in a different order. Further, in some embodiments, some actions listed in FIG. 3 are omitted from method 300.

Method 300 begins at 310 where a reference voltage is applied to an input capacitor of a cyclic DAC in response to a least significant bit of a digital word. In some embodiments, this may correspond to applying either $+V_{REF}$ or $-V_{REF}$ to capacitor 112 (FIG. 1) during phase two of operation. In other embodiments, this may correspond to applying a reference voltage to two input capacitors in a differential cyclic DAC circuit. At 320, the reference voltage is integrated to create an output voltage substantially equal to negative one half of the reference voltage. For example, as shown in Tables 2 and 3 for the two examples described above with reference to FIG. 1, when $-V_{REF}$ is applied to the input capacitor for the least significant input bit, the integrator circuit that includes opamp 120 and capacitors 112 and 124 produces an output voltage of substantially $V_{REF}/2$.

At 330, the output voltage is fed back to the input capacitor. In some embodiments, this corresponds to phase one of the next bit. For example, referring now back to FIG. 1, switch 132 is closed to couple feedback amplifier 130 in a negative unity gain feedback loop. When the feedback voltage is applied to the input side of the input capacitor, the opposite side of the capacitor is isolated from the opamp input, and is also coupled to a reference node using switch 114. Also for example, referring now back to FIG. 2, switches 212 and 214 are closed to couple each output to an input of opposite polarity, to provide a negative unity gain feedback arrangement. When the feedback voltages are applied to the input side of the input capacitors, the opposite side of the capacitors are isolated from the opamp inputs, and are also coupled to a reference node using switches 216 and 218.

At 340, the previous actions in method 300 are repeated for the remaining bits of the digital word. For example, when the digital word includes three bits, the previous actions are repeated two times. Further, when the digital word includes ten bits, the previous actions are repeated nine times.

Figure 4:
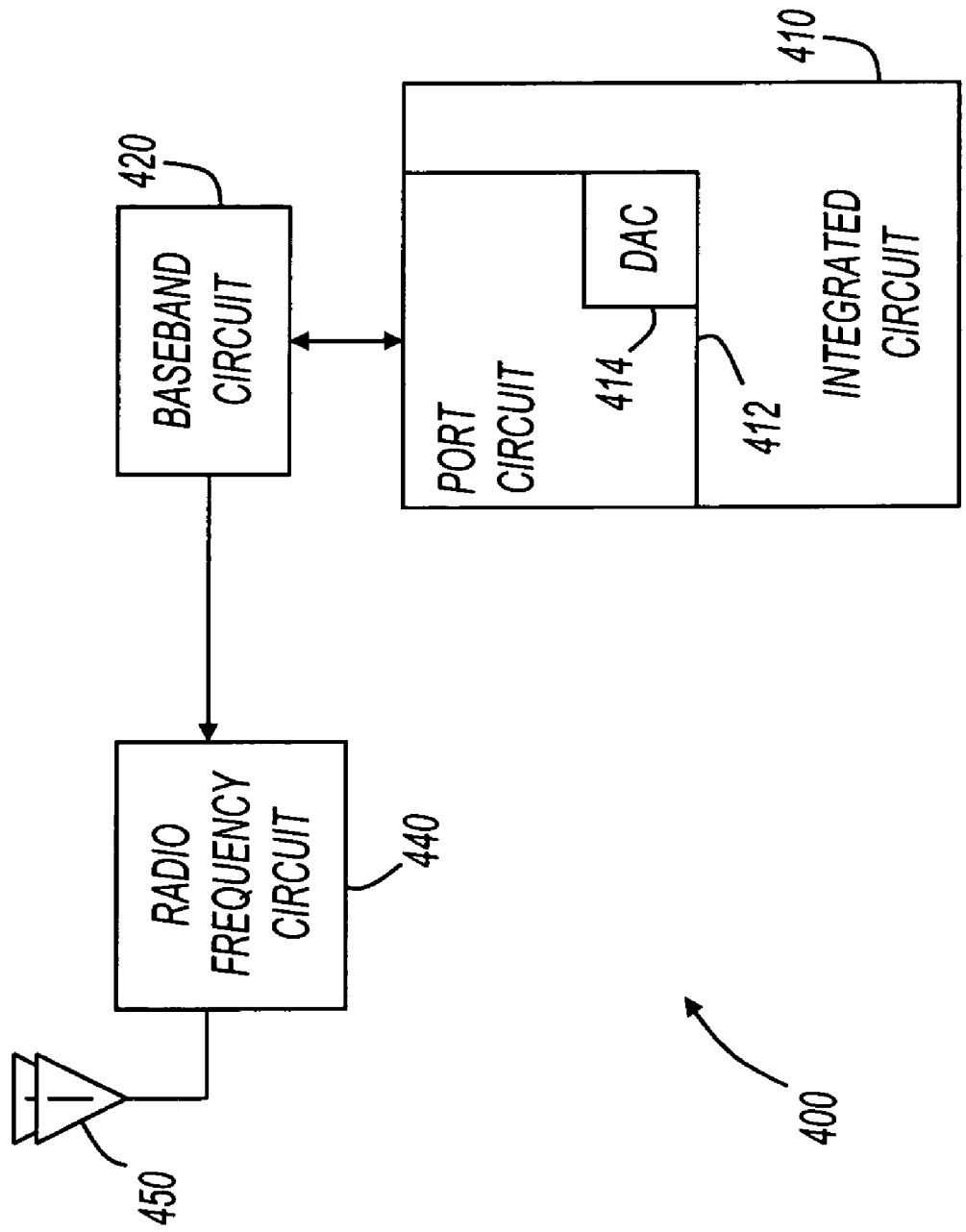
FIG. 4 shows a system diagram in accordance with various embodiments of the present invention.

FIG. 4 shows a system diagram in accordance with various embodiments of the present invention. FIG. 4 shows system 400 including integrated circuit 410, baseband circuit 420, radio frequency (RF) circuit 440, and antennas 450. In operation, system 400 processes a signal to be transmitted using baseband circuit 420, further processes it using RF circuit 440, and transmits it using antennas 450. Antennas 450 may include directional antennas or omni-directional antennas. As used herein, the term omni-directional antenna refers to any antenna having a substantially uniform pattern in at least one plane. For example, in some embodiments, one or more of antennas 450 may be an omni-directional antenna such as a dipole antenna, or a quarter wave antenna. Also for example, in some embodiments, one or more of antennas 450 may be a directional antenna such as a parabolic dish antenna or a Yagi antenna.

Integrated circuit 410 includes port circuit 412 and DAC circuit 414. Digital to analog converter (DAC) circuit 414 may be any of the DAC circuit embodiments described herein. For example, in some embodiments, DAC circuit 414 includes one or more of DAC circuit 100 (FIG. 1), or one or more of DAC circuits 200 (FIG. 2).

Integrated circuit 410 may be any type of integrated circuit capable of including one or more port circuits with a DAC circuit as shown. For example, integrated circuit 410 can be a processor such as a microprocessor, a digital signal processor, a microcontroller, or the like. Integrated circuit 410 can also be an integrated circuit other than a processor such as an application-specific integrated circuit (ASIC), a communications device, a memory controller, or a memory such as a dynamic random access memory (DRAM). For ease of illustration, portions of integrated circuit 410 are not shown. The integrated circuit may include much more circuitry than illustrated in FIG. 4 without departing from the scope of the present invention.

In some embodiments, DAC 414 is part of a built-in self test circuit within port circuit 412 that validates link performance by capturing transmission line waveforms, eye diagrams, and noise and jitter distributions. DAC 414 may provide calibration of several functional blocks within port circuit 412 to overcome the effects of non-linearity, offset and gain error. For example, port circuit 412 may include a comparator (not shown) with a digitally programmable offset voltage. In some embodiments, DAC 412 may be utilized during a built-in self test and calibration of the comparator.

Baseband circuit 420 may be any type of circuit to provide digital baseband processing in a communications system. In some embodiments, baseband circuit 420 includes a processor such as a digital signal processor (DSP), and in other embodiments, baseband circuit 420 is implemented as a system on a chip (SOC) that include many functional blocks. In some embodiments, baseband circuit 420 provides digital data to RF circuit 440.

Radio frequency circuit 440 receives data from baseband circuit 420 and performs additional processing. For example, in some embodiments, RF circuit 440 performs modulation, filtering, frequency up-conversion, amplification, or the like. Further, in some embodiments, RF circuit also includes a receiver, and performs low noise amplification (LNA), frequency down-conversion, demodulation, or other functions.

Systems represented by the various foregoing figures can be any type of system that includes one more antennas. Examples of represented systems include computers with wireless functionality (e.g., desktops, laptops, handhelds, servers, tablets, web appliances, routers, etc.), wireless communications devices (e.g., cellular phones, cordless phones, pagers, personal digital assistants, etc.), entertainment devices (e.g., televisions, radios, stereos, tape and compact disc players, video cassette recorders, camcorders, digital cameras, MP3 (Motion Picture Experts Group, Audio Layer 3) players, video games, watches, etc.), and the like. Many other system uses for DAC circuits exist. For example, DAC circuits may be used in systems without one or more antennas.

Digital to analog converter circuits, port circuits, integrated circuits, and other embodiments of the present invention can be implemented in many ways. In some embodiments, they are implemented in integrated circuits and systems. In some embodiments, design descriptions of the various embodiments of the present invention are included in libraries that enable designers to include them in custom or semi-custom designs. For example, any of the disclosed embodiments can be implemented in a synthesizable hardware design language, such as VHDL or Verilog, and distributed to designers for inclusion in standard cell designs, gate arrays, or the like. Likewise, any embodiment of the present invention can also be represented as a hard macro targeted to a specific manufacturing process.

Although the present invention has been described in conjunction with certain embodiments, it is to be understood that modifications and variations may be resorted to without departing from the spirit and scope of the invention as those skilled in the art readily understand. Such modifications and variations are considered to be within the scope of the invention and the appended claims.

What is claimed is:

1. A digital to analog converter comprising:

an amplifier;

a first capacitor coupled to an input node of the amplifier;

a second capacitor coupled between the input node of the amplifier and an output node of the amplifier, wherein the second capacitor has a capacitance value substantially twice a capacitance value of the first capacitor; and at least one switching element coupled to the first capacitor, wherein the switching element is coupled to be responsive to a least-significant-bit first sequence of digital bits in a digital word.

2. The digital to analog converter of claim 1 wherein the amplifier comprises an operational amplifier.

3. The digital to analog converter of claim 1 further comprising a conditional feedback path coupled between the output of the amplifier and the first capacitor.

4. The digital to analog converter of claim 3 wherein the conditional feedback path has a gain of substantially −1.

5. The digital to analog converter of claim 1 wherein the at least one switching element is coupled to to apply a reference voltage to the first capacitor.

6. The digital to analog converter of claim 5 wherein the at least one switching element includes a first switching element coupled to conditionally apply a positive reference voltage to the first capacitor, and a second switching element coupled to conditionally apply a negative reference voltage to the first capacitor.

7. A digital to analog converter comprising:
an operational amplifier configured as an integrator with a feedback capacitor of 2C where C is a capacitance value;
an input capacitor of substantially C; and
switching circuitry to successively impose one of two reference voltages in response to a digital code word applied least-significant-bit first.

8. The digital to analog converter of claim 7 wherein the switching circuitry is coupled to apply a positive reference voltage to the input capacitor when an applied bit of the digital code word has a first value, and to apply a negative reference voltage to the input capacitor when the applied bit of the digital code word has a second value.

9. The digital to analog converter of claim 7 further comprising a feedback amplifier to feed back an output voltage to the input capacitor when when neither of the two reference voltages is imposed.

10. The digital to analog converter of claim 7 further comprising a unity gain feedback amplifier.

11. A method comprising:
applying a reference voltage to an input capacitor of a cyclic digital to analog converter in response to a least significant bit of a digital word;
integrating the reference voltage to create an output voltage substantially equal to negative one half of the reference voltage;
feeding back the output voltage to the input capacitor; and
repeating the applying, integrating, and feeding back operations for remaining bits of the digital word applied from least-significant-bit to most-significant-bit.

12. The method of claim 11 wherein applying a reference voltage comprises applying a first reference voltage when the least significant bit has a first value, and applying a second reference voltage when the least significant bit has a second value.

13. The method of claim 11 wherein integrating the reference voltage comprises integrating the reference voltage with an operational amplifier having capacitive feedback.

14. An electronic system comprising:
an antenna; and
an integrated circuit to operate on signals received by the antenna, the integrated circuit including a port circuit having a digital to analog converter that includes an amplifier, a first capacitor coupled to an input node of the amplifier, a second capacitor coupled between the input node of the amplifier and an output node of the amplifier, wherein the second capacitor has a capacitance value substantially twice a capacitance value of the first capacitor, and at least one switching element coupled to the first capacitor, wherein the switching element is coupled to be responsive to a least-significant-bit first sequence of digital bits in a digital word.

15. The electronic system of claim 14 wherein the amplifier comprises an operational amplifier.

16. The electronic system of claim 14 further comprising a negative unity gain feedback path coupled between the output of the amplifier and the first capacitor.

17. The electronic system of claim 16 wherein the amplifier comprises a differential amplifier, and the negative unit gain feedback path includes switches to conditionally couple output nodes to input nodes with opposite polarity.

* * * * *